(12) United States Patent
Utsunomiya

(10) Patent No.: US 8,390,282 B2
(45) Date of Patent: Mar. 5, 2013

(54) MAGNETIC SENSOR CIRCUIT

(75) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 282 days.

(21) Appl. No.: 12/709,106

(22) Filed: Feb. 19, 2010

(65) Prior Publication Data

US 2010/0213932 A1  Aug. 26, 2010

(30) Foreign Application Priority Data

Feb. 23, 2009  (JP) .................. 2009-039339

(51) Int. Cl.
*G01R 33/07* (2006.01)
(52) U.S. Cl. ........................................ 324/251
(58) Field of Classification Search ............... 324/251, 324/117 H, 117 R, 762.01–762.1; 257/48; 438/14–18
See application file for complete search history.

(56) References Cited

U.S. PATENT DOCUMENTS

2005/0218900 A1* 10/2005 Iwabuchi et al. ............. 324/426
2007/0221997 A1* 9/2007 Chen et al. .................... 257/379

FOREIGN PATENT DOCUMENTS

JP  2005-260629 A  9/2005

* cited by examiner

*Primary Examiner* — Tung X Nguyen
(74) *Attorney, Agent, or Firm* — Brinks Hofer Gilson & Lione

(57) ABSTRACT

Provided is a magnetic sensor circuit capable of a low-voltage operation, which comprises a Hall element and a magnetic offset cancellation circuit for the Hall element. In the magnetic sensor circuit using the Hall element, at the time of turning on transmission gates for switching connections between input terminals of an amplifier circuit in the magnetic offset cancellation circuit and electrodes of the Hall element in order to cancel a magnetic offset of the Hall element, gates of N-channel transistors in the transmission gates are set at voltages higher than a power supply voltage by a drive circuit.

4 Claims, 4 Drawing Sheets

MAGNETIC SENSOR CIRCUIT

RELATED APPLICATIONS

This application claims priority under 35 U.S.C. §119 to Japanese Patent Application No. 2009-039339 filed on Feb. 23, 2009, the entire content of which is hereby incorporated by reference.

BACKGROUND OF THE INVENTION

The present invention relates to a magnetic sensor circuit including a Hall element and a magnetic offset cancellation circuit therefor, in particular, a magnetic sensor circuit that operates at a power supply voltage lower than heretofore.

DESCRIPTION OF THE RELATED ART

A magnetic sensor circuit using a Hall element detects magnetism by using a phenomenon that, when a current is caused to flow between a pair of opposite electrodes among electrodes provided on four corners of the Hall element, and a magnet is brought near to the Hall element, a potential difference is generated between the other pair of opposite electrodes between which the current is not caused to flow. However, in most of the Hall elements, owing to process fluctuations, a potential difference is generated between the other pair of opposite electrodes between which the current is not caused to flow even if the magnet is not brought nearby, and an erroneous detection is conducted as if the magnet were located nearby. A quantity of magnetism detected though the magnet is not brought nearby is referred to as a magnetic offset, and it is a magnetic offset cancellation circuit that cancels this magnetic offset.

FIG. 4 is a block diagram illustrating a conventional magnetic sensor circuit.

The magnetic sensor circuit includes: a Hall element 100; switching circuits 101, 102, 201, and 202 for applying voltages to the Hall element 100 in a switching manner; transmission gates 103, 104, 203, and 204 which output signals of the Hall element 100 in a switching manner; an amplifier circuit 110 that receives the signals of the Hall element 100; a switch 105 and a capacitor C1; and a switch 205 and a capacitor C2.

In order to cancel the magnetic offset, a shape of the Hall element 100 is a vertically and horizontally symmetric shape like a square. A power supply terminal is connected to an electrode a of the Hall element 100 through the switch 101, and is connected to an electrode c of the Hall element 100 through the switch 201. A GND terminal is connected to an electrode d of the Hall element 100 through the switch 202, and is connected to an electrode b of the Hall element 100 through the switch 102. A positive input terminal of the amplifier circuit 110 is connected to the electrode a of the Hall element 100 through the transmission gate 203, and is connected to the electrode c of the Hall element 100 through the transmission gate 103. A negative input terminal of the amplifier circuit 110 is connected to the electrode d of the Hall element 100 through the transmission gate 104, and is connected to the electrode b of the Hall element 100 through the transmission gate 204. An output terminal of the amplifier circuit 110 is connected to the capacitor C1 through the switch 105, and is connected to the capacitor C2 through the switch 205.

By adopting the configuration described above, the magnetic sensor circuit operates in the following way, and detects the magnetism.

In a first state, the switches 101 and 102 and the transmission gates 103 and 104 are turned on, the switches 201 and 202 and the transmission gates 203 and 204 are turned off, the switch 105 is turned on, and the switch 205 is turned off. In the first state, a current flows from the electrode a of the Hall element 100 to the electrode b thereof, and a voltage proportional to a potential difference generated between the electrode c and electrode d of the Hall element 100 is stored in the capacitor C1.

In a second state, the switches 101 and 102 and the transmission gates 103 and 104 are turned off, the switches 201 and 202 and the transmission gates 203 and 204 are turned on, the switch 105 is turned off, and the switch 205 is turned on. In the second state, a current flows from the electrode c of the Hall element 100 to the electrode d thereof, and a voltage proportional to a potential difference generated between the electrode a and electrode b of the Hall element 100 is stored in the capacitor C2.

Here, a voltage proportional to the quantity of magnetism is stored in the capacitor C1, and a voltage proportional to the magnetic offset is stored in the capacitor C2. The voltage proportional to the quantity of magnetism, which is stored in the capacitor C1, is reverse in polarity to a voltage proportional to the quantity of magnetism, which is stored in the capacitor C2. A voltage proportional to the magnetic offset, which is stored in the capacitor C1, is the same in polarity as the voltage proportional to the magnetic offset, which is stored in the capacitor C2. Hence, when the voltage of the capacitor C2 is subtracted from the voltage of the capacitor C1, only the voltage proportional to the quantity of magnetism can be taken out. In other words, the magnetic offset can be cancelled.

Next, a description is made of a drive method for each of the transmission gates. In order to turn on the transmission gate, a high-level voltage as a power supply voltage is applied to a gate of an NMOS transistor, and a voltage of a low level as a voltage level of the GND terminal is applied to a gate of a PMOS transistor. In order to turn off the transmission gate, such a low-level voltage is applied to the gate of the NMOS transistor in the transmission gate, and the high-level voltage is applied to the gate of the PMOS transistor therein (for example, see JP 2005-260629 A (FIG. 3)).

In the above-mentioned drive method for the transmission gate, a voltage that can pass through the transmission gate when the transmission gate is turned on is a voltage higher than an absolute value of a threshold voltage of the PMOS transistor or a voltage lower than a value obtained by subtracting a threshold voltage of the NMOS transistor from the power supply voltage. For example, it is assumed that the power supply voltage is 1.2 V, that the threshold of the NMOS transistor is 0.7 V, and that the threshold of the PMOS transistor is −0.7 V. In the conventional drive method for the transmission gate, a voltage, which is equal to or more than 0.5 V as the value obtained by subtracting 0.7 V as the threshold of the NMOS transistor from 1.2 V as the power supply voltage, and is equal to or less than 0.7 V as the absolute value of the threshold of the PMOS transistor, cannot pass through the transmission gate. As a method for solving this problem, it is conceived to decrease the threshold of the NMOS transistor and the absolute value of the threshold of the PMOS transistor. However, in this method, such a new problem occurs, that an off-leak current of the transmission gate is increased, and magnetic detection accuracy is deteriorated by the off-leak current.

Meanwhile, it is necessary that the shape of the Hall element capable of cancelling the magnetic offset be the vertically and horizontally symmetric shape like a square. In the case of this shape, the voltage output from the Hall element becomes approximately a half of the power supply voltage. Hence, when the power supply voltage is 1.2 V, the output voltage of the Hall element becomes 0.6 V, and in the above-mentioned conventional drive method for the transmission gate, the output voltage of the Hall element cannot pass through the transmission gate that is turned on.

In other words, in the drive method for the transmission gate in the conventional magnetic sensor circuit, when the power supply voltage drops down, the voltage of the Hall element is not transmitted properly to the amplifier circuit through the transmission gate, and accordingly, there has been a problem that it is impossible to detect a correct quantity of magnetism.

SUMMARY OF THE INVENTION

The present invention has been made in consideration of the above-mentioned problems. It is an object of the present invention to provide a magnetic sensor circuit which includes a Hall element and a magnetic offset cancellation circuit for the Hall element and is capable of detecting a correct quantity of magnetism even if a power supply voltage drops down.

In order to solve the above-mentioned problems, the present invention provides a magnetic sensor circuit including a drive circuit that turns on and off transmission gates, in which, at a time of turning on the transmission gates, the drive circuit drives gates of N-channel transistors in the transmission gates at voltages higher than a power supply voltage.

In the magnetic sensor circuit of the present invention, in the transmission gates which switch connections between input terminals of an amplifier circuit and electrodes of the Hall element, the voltages higher than the power supply voltage are applied to the gates of the NMOS transistors at the time of turning on the transmission gates. Accordingly, a voltage of the Hall element can be accurately transmitted to the amplifier circuit even at a low power supply voltage, and the accurate quantity of magnetism can be detected at a power supply voltage lower than heretofore.

DETAILED DESCRIPTION OF THE PREFERRED EMBODIMENTS

Hereinafter, an embodiment of the present invention is described with reference to the accompanying drawings.

Figure 1:
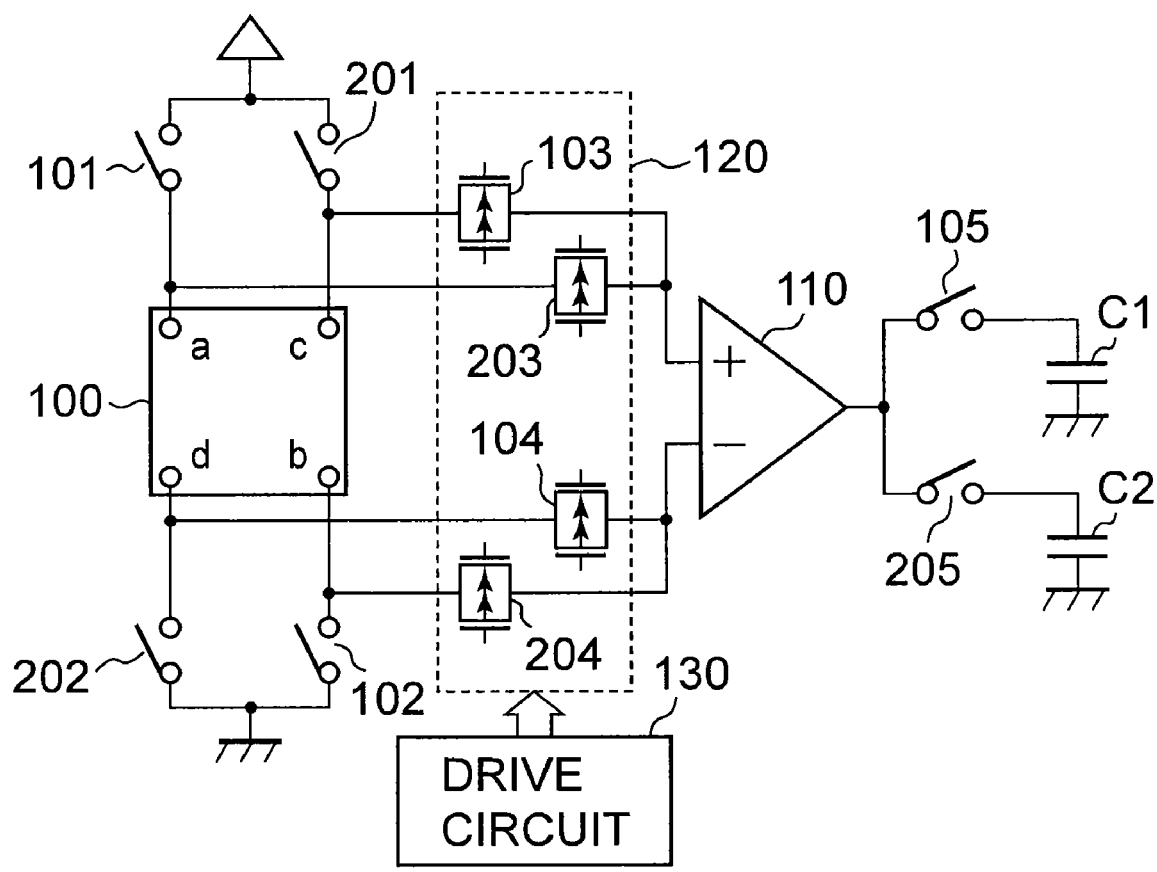
FIG. 1 is a block diagram illustrating a magnetic sensor circuit of the present invention.

FIG. 1 is a block diagram illustrating a magnetic sensor circuit of the present invention. The magnetic sensor circuit of the present invention includes: a Hall element 100; switching circuits 101, 102, 201, and 202 for applying power supply voltages to the Hall element 100 in a switching manner; a transmission gate group 120 formed of transmission gates 103, 104, 203, and 204 which output signals of the Hall element 100 in a switching manner; a drive circuit 130 that drives the transmission gate group 120; an amplifier circuit 110 that receives the signals of the Hall element 100; a switch 105 and a capacitor C1; and a switch 205 and a capacitor C2.

In order to cancel a magnetic offset, a shape of the Hall element 100 is a vertically and horizontally symmetric shape like a square. A power supply terminal is connected to an electrode a of the Hall element 100 through the switch 101, and is connected to an electrode c of the Hall element 100 through the switch 201. A GND terminal is connected to an electrode d of the Hall element 100 through the switch 202, and is connected to an electrode b of the Hall element 100 through the switch 102. A positive input terminal of the amplifier circuit 110 is connected to the electrode a of the Hall element 100 through the transmission gate 203, and is connected to the electrode c of the Hall element 100 through the transmission gate 103. A negative input terminal of the amplifier circuit 110 is connected to the electrode d of the Hall element 100 through the transmission gate 104, and is connected to the electrode b of the Hall element 100 through the transmission gate 204. An output terminal of the amplifier circuit 110 is connected to the capacitor C1 through the switch 105, and is connected to the capacitor C2 through the switch 205.

By adopting the configuration described above, the magnetic sensor circuit of the present invention operates in the following way, and detects magnetism.

In a first state, the switches 101 and 102 and the transmission gates 103 and 104 are turned on, the switches 201 and 202 and the transmission gates 203 and 204 are turned off, the switch 105 is turned on, and the switch 205 is turned off. In the first state, a current flows from the electrode a of the Hall element 100 to the electrode b thereof, and a voltage proportional to a potential difference generated between the electrode c and electrode d of the Hall element 100 is stored in the capacitor C1.

In a second state, the switches 101 and 102 and the transmission gates 103 and 104 are turned off, the switches 201 and 202 and the transmission gates 203 and 204 are turned on, the switch 105 is turned off, and the switch 205 is turned on. In the second state, a current flows from the electrode c of the Hall element 100 to the electrode d thereof, and a voltage proportional to a potential difference generated between the electrode a and electrode b of the Hall element 100 is stored in the capacitor C2.

Here, a voltage proportional to a quantity of magnetism is stored in the capacitor C1, and a voltage proportional to the magnetic offset is stored in the capacitor C2. The voltage proportional to the quantity of magnetism, which is stored in the capacitor C1, is reverse in polarity to a voltage proportional to the quantity of magnetism, which is stored in the capacitor C2. A voltage proportional to the magnetic offset, which is stored in the capacitor C1, is the same in polarity as the voltage proportional to the magnetic offset, which is stored in the capacitor C2. Hence, when the voltage of the capacitor C2 is subtracted from the voltage of the capacitor C1, only the voltage proportional to the quantity of magnetism can be taken out. In other words, the magnetic offset can be cancelled.

Next, a description is made of a drive method for the transmission gate group 120. The magnetic sensor circuit of the present invention includes the drive circuit 130 for driving the transmission gate group 120. The drive circuit 130 applies a voltage higher than the power supply voltage to a gate of an NMOS transistor in the transmission gate that is to be turned on, and applies a voltage of a low level as a voltage level of the GND terminal to a gate of a PMOS transistor therein. Moreover, the drive circuit 130 applies such a low-level voltage to a gate of an NMOS transistor in the transmission gate that is to be turned off, and applies such a high-level voltage to a gate of a PMOS transistor therein.

Figure 2:
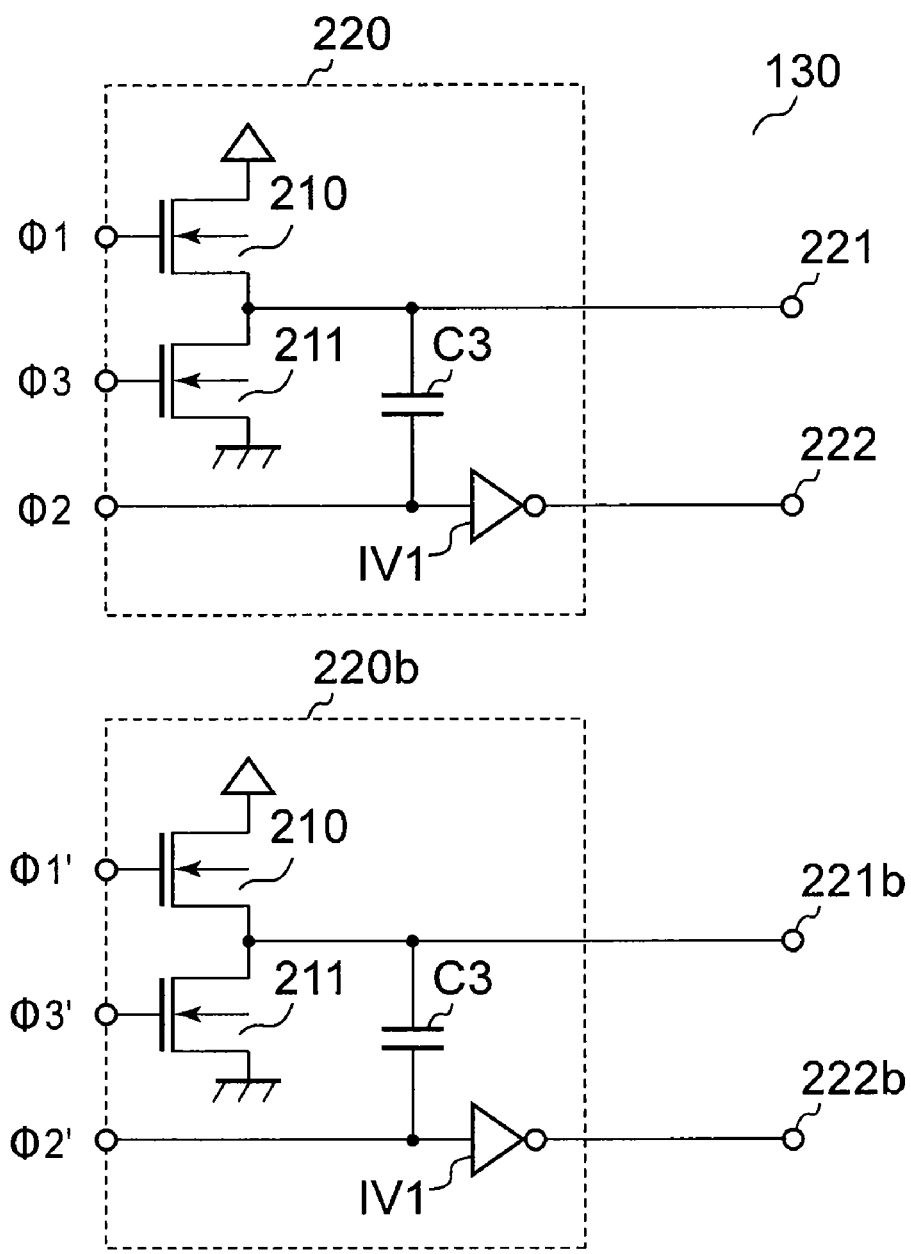
FIG. 2 is a block diagram illustrating an example of a drive circuit for transmission gates.

FIG. 2 is a block diagram illustrating an example of the drive circuit 130 in the magnetic sensor circuit of the present invention.

The drive circuit 130 includes a drive unit 220 that generates a voltage higher than the power supply voltage. The drive unit 220 includes NMOS transistors 210 and 211 for boost switching, a capacitor C3 for performing a boost operation, and an inverter circuit IV1. In the NMOS transistor 210, a drain thereof is connected to the power supply terminal, and a source thereof is connected to a drain of the NMOS transistor 211. In the NMOS transistor 211, a source thereof is connected to the GND terminal. A first electrode of the capacitor C3 is connected to a node between the NMOS transistor 210 and the NMOS transistor 211. An input terminal of the inverter circuit IV1 is connected to a second electrode of the capacitor C3. A first output terminal 221 is connected to the first electrode of the capacitor C3, and a second output terminal 222 is connected to an output terminal of the inverter circuit IV1. A switching signal Φ1 is input to a gate of the NMOS transistor 210, a switching signal Φ3 is input to a gate of the NMOS transistor 211, and a switching signal Φ2 is input to the second electrode of the capacitor C3 and the input terminal of the inverter circuit IV1. The first output terminal 221 is connected to the gates of the NMOS transistors in the transmission gates, and the second output terminal 222 is connected to the gates of the PMOS transistors in the transmission gates.

Figure 3:
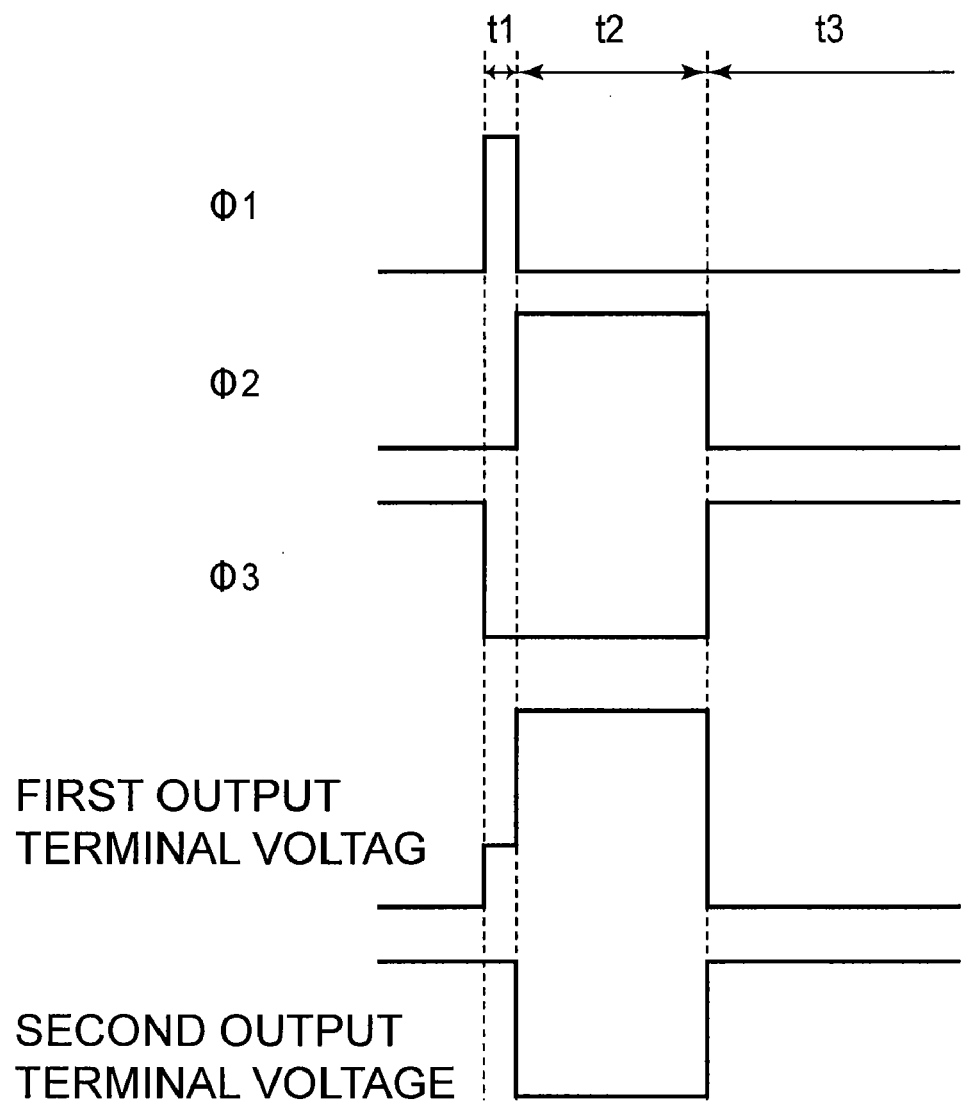
FIG. 3 is a time chart for illustrating operations of the drive circuit for the transmission gates.
Figure 4:
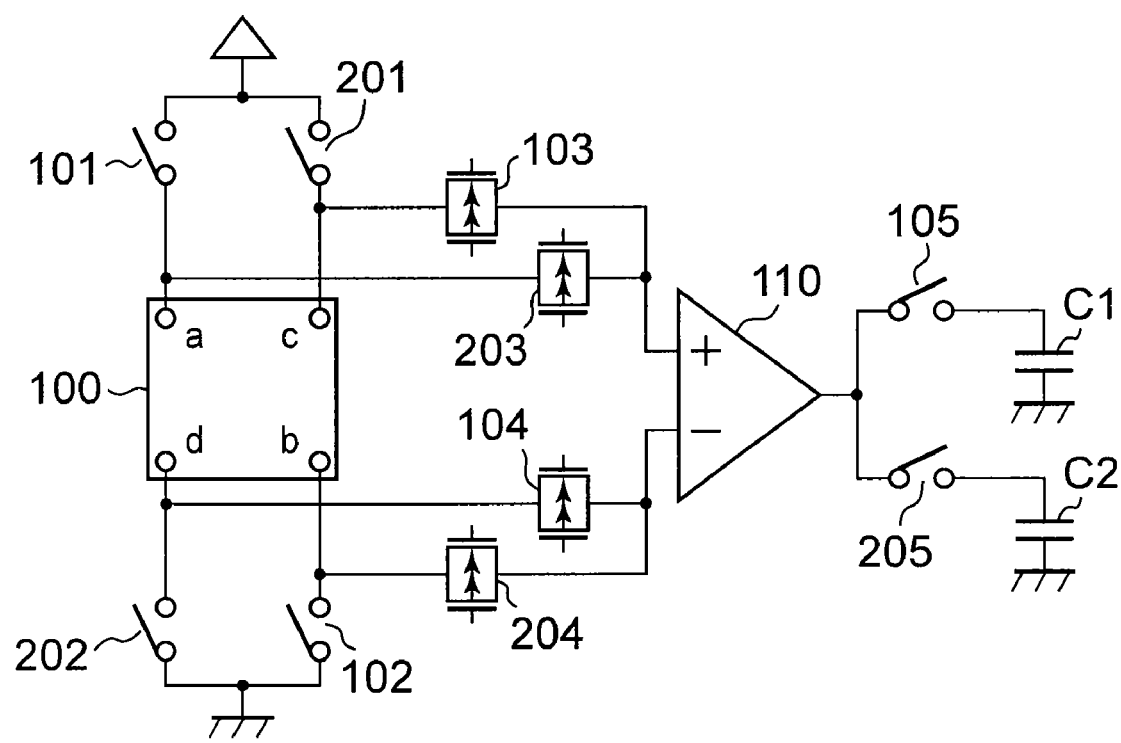
FIG. 4 is a block diagram illustrating a conventional magnetic sensor circuit.

FIG. 3 is a time chart for illustrating operations of the drive circuit. A description is made of operations of the drive circuit 130 based on the time chart of FIG. 3.

During a period t1, the switching signal Φ1 is at the high level, and the switching signals Φ2 and Φ3 are at the low level. During this period t1, the NMOS transistor 210 is turned on, and the capacitor C3 is charged with the voltage obtained by subtracting a threshold of the NMOS transistor from the power supply voltage. The voltage of the capacitor C3 is output to the first output terminal 221, and the high-level voltage is output to the second output terminal 222. Hence, the NMOS transistors in the transmission gates are slightly turned on, and the PMOS transistors therein are fully turned off.

During a period t2, the switching signals Φ1 and Φ3 are at the low level, and the switching signal Φ2 is at the high level. During this period t2, the NMOS transistor 210 and the NMOS transistor 211 are turned off, and the second electrode of the capacitor C3 rises to the high level. To the first output terminal 221, a voltage is output, which is boosted by the power supply voltage from the voltage in the period t1 by capacitive coupling of the capacitor C3, and to the second output terminal 222, the low-level voltage is output. Hence, both of the NMOS transistors and the PMOS transistors in the transmission gates are fully turned on.

During a period t3, the switching signals Φ1 and Φ2 are at the low level, and the switching signal Φ3 is at the high level. During this period t3, the NMOS transistor 211 is turned on, and the second electrode of the capacitor C3 drops to the low level. The low-level voltage is output to the first output terminal 221, and the high-level voltage is output to the second output terminal 222. Hence, both of the NMOS transistors and the PMOS transistors in the transmission gates are fully turned off.

Here, the drive circuit illustrated in FIG. 2 includes two drive units (220 and 220b). For example, the output terminals 221 and 222 of the drive unit 220 are connected to the transmission gates 103 and 104, and output terminals 221b and 222b of the drive unit 220b are connected to the transmission gates 203 and 204. Then, the drive unit 220 operates as illustrated in FIG. 3 in synchronization with the switches 101 and 102, and outputs the voltages to turn on the transmission gates. Further, the drive unit 220b operates as illustrated in FIG. 3 in synchronization with the switches 201 and 202, and outputs the voltages to turn on the transmission gates.

As described above, in the magnetic sensor circuit of the present invention, the drive circuit that outputs the drive voltages of the transmission gates, which are higher than the power supply voltage, is provided. Accordingly, even if the voltage applied to the Hall element is low, the voltage concerned can be accurately transmitted to the input terminals of the amplifier circuit through the transmission gates. For example, when the power supply voltage is as low as 1.2 V, the gate voltage of the NMOS transistor in each of the transmission gates becomes 1.7 V as a value obtained by subtracting 0.7 V as the threshold of the NMOS transistor from 2.4 V twice the power supply voltage. Hence, the voltage which the NMOS transistor in the transmission gate can pass therethrough becomes a voltage lower than 1.0 V obtained by subtracting 0.7 V as the threshold of the NMOS transistor from 1.7 V described above. In other words, the transmission gate can accurately transmit, to the amplifier circuit, the output voltage (0.6 V) of the Hall element, which is approximately a half of 1.2 V as the power supply voltage.

Note that the drive circuit 130 illustrated in FIG. 2 is merely an example, and may include the drive unit 220 and a circuit that outputs the voltages to turn on the transmission gates and the voltages to turn off the transmission gates thereto in a switching manner.

Further, it is needless to say that such a circuit configuration of the present invention is effective for a magnetic sensor circuit having any configuration as long as the circuit configuration concerned is a configuration of switching the connections between the electrodes of the Hall element and the input terminals of the amplifier circuit by the transmission gates in order to cancel the magnetic offset of the Hall element.

Further, as described above, the drive circuit for the transmission gates in the present invention has such a configuration of generating a boosted voltage only at the time of turning on the transmission gate, and still further, in most cases, the magnetic detection of the magnetic sensor circuit is conducted intermittently. Accordingly, the period when the transmission gate is turned on is extremely short. Hence, in comparison with the case of always using a boosted voltage generated in a booster circuit, a current consumption of the drive circuit for the transmission gates in the present invention becomes extremely low.

Further, in the description of the present invention, the description has been made only of the operations in the case where the power supply voltage is low. However, in the case where the power supply voltage is high, the voltage of the Hall element can be allowed to pass through each of the transmission gates only by the PMOS transistor in the transmission gate concerned, and accordingly, it is needless to say that the gate voltage of the NMOS transistor in the same transmission gate may be set to any voltage as long as the voltage does not exceed a gate withstand voltage of the NMOS transistor concerned.

Further, as the threshold of the NMOS transistor 210 of the drive circuit 130 is decreased more, the gate voltage of the NMOS transistor in the transmission gate that is to be turned on rises more, and even at a lower power supply voltage, the voltage of the Hall element can be accurately transmitted to the amplifier circuit through the transmission gate, and accordingly, it is needless to say that a magnetic sensor circuit capable of accurately detecting the quantity of magnetism even at a lower power supply voltage can be realized.

What is claimed is:

1. A magnetic sensor circuit, comprising:
a Hall element connected to a power supply and a ground by respective first and second pairs of switches; and
a magnetic offset cancellation circuit that cancels a magnetic offset of the Hall element,
wherein the magnetic offset cancellation circuit comprises:
an amplifier circuit;
transmission gates comprising NMOS and PMOS transistors coupled to the first and second pairs of switches that switch connections of electrodes of the Hall element and output a voltage of the Hall element to the amplifier circuit; and
a drive circuit that drives the transmission gates, the drive circuit comprising:
a first MOS transistor and a second MOS transistor connected in series between the power supply voltage and a ground voltage, the first MOS transistor and a second MOS transistor having the same conductivity type;
a capacitor in which a first electrode is connected to a node between the first MOS transistor and the second MOS transistor; and
an inverter circuit in which an input terminal has a second electrode of the capacitor connected thereto, and
wherein the drive circuit includes output terminals connected to the NMOS and PMOS transistors such that the drive circuit, in synchronization with the pairs of switches, supplies voltages higher than a power supply voltage to gates of the NMOS transistors in the transmission gates at a time of turning on the transmission gates.

2. A magnetic sensor circuit having a function to cancel a magnetic offset of a Hall element, comprising:
a Hall element that comprises a first pair of electrodes arranged on a diagonal line, and a second pair of electrodes arranged on a diagonal line different from the diagonal line for the first pair of electrodes, and generates a Hall voltage corresponding to a magnetic flux that penetrates the Hall element itself;
a first pair of switch circuits which are connected to the first pair of electrodes and include transmission gates;
a second pair of switch circuits which are connected to the second pair of electrodes and include transmission gates;
an amplifier circuit that comprises input terminals having the first pair of switch circuits and the second pair of switch circuits respectively connected thereto, and receives the Hall voltage output by one of the first pair of electrodes and the second pair of electrodes in a switching manner; and
a drive circuit that drives the transmission gates, the drive circuit comprising:
a first MOS transistor and a second MOS transistor connected in series between the power supply voltage and a ground voltage, the first MOS transistor and a second MOS transistor having the same conductivity type;
a capacitor in which a first electrode is connected to a node between the first MOS transistor and the second MOS transistor; and
an inverter circuit in which an input terminal has a second electrode of the capacitor connected thereto, and
wherein the drive circuit includes output terminals connected to NMOS and PMOS transistors of the transmission gates such that the drive circuit, in synchronization with the pairs of switches, supplies voltages higher than a power supply voltage to gates of the NMOS transistors in the transmission gates at a time of turning on the transmission gates.

3. A magnetic sensor circuit having a function to cancel a magnetic offset of a Hall element, comprising:
a Hall element that comprises a first pair of electrodes arranged on a diagonal line, and a second pair of electrodes arranged on a diagonal line different from the diagonal line for the first pair of electrodes, and generates a Hall voltage corresponding to a magnetic flux that penetrates the Hall element itself;
a first pair of switch circuits which are connected to the first pair of electrodes and include transmission gates;
a second pair of switch circuits which are connected to the second pair of electrodes and include transmission gates;
an amplifier circuit that comprises input terminals having the first pair of switch circuits and the second pair of switch circuits respectively connected thereto, and receives the Hall voltage output by one of the first pair of electrodes and the second pair of electrodes in a switching manner; and
a drive circuit that drives the transmission gates,
wherein the drive circuit supplies voltages higher than a power supply voltage to gates of N-channel transistors in the transmission gates at a time of turning on the transmission gates, and
wherein the drive circuit comprises a drive unit including:
a first MOS transistor and a second MOS transistor connected in series between the power supply voltage and a ground voltage, the first MOS transistor and a second MOS transistor having the same conductivity type;
a capacitor in which a first electrode is connected to a node between the first MOS transistor and the second MOS transistor; and
an inverter circuit in which an input terminal has a second electrode of the capacitor connected thereto,
wherein, in the drive unit, the first electrode of the capacitor is connected to a first output terminal of the drive unit, and the second electrode of the capacitor is connected to a second output terminal of the drive unit, and
wherein the first output terminal is connected to the gates of the N-channel transistors in the transmission gates, and the second output terminal is connected to gates of P-channel transistors in the transmission gates.

4. A magnetic sensor circuit according to claim 3, wherein the drive circuit further comprises an additional drive unit.

* * * * *